US008659864B2

(12) United States Patent
Uemura

(10) Patent No.: US 8,659,864 B2
(45) Date of Patent: Feb. 25, 2014

(54) POWER SEMICONDUCTOR DEVICE CURRENT DETECTOR CIRCUIT AND DETECTION METHOD

(75) Inventor: Hirofumi Uemura, Hino (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 235 days.

(21) Appl. No.: 13/243,931

(22) Filed: Sep. 23, 2011

(65) Prior Publication Data

US 2012/0086424 A1 Apr. 12, 2012

(30) Foreign Application Priority Data

Oct. 8, 2010 (JP) ................................. 2010-228103

(51) Int. Cl.
*H02H 3/24* (2006.01)
*H02H 9/04* (2006.01)
*G05F 3/16* (2006.01)
*G05F 3/20* (2006.01)

(52) U.S. Cl.
USPC .......................................... 361/93.1; 323/315

(58) Field of Classification Search
USPC .................. 361/93.1, 93.7–93.9; 323/315
See application file for complete search history.

(56) References Cited

U.S. PATENT DOCUMENTS

| 4,893,158 | A | | 1/1990 | Mihara et al. |
| 5,375,028 | A | * | 12/1994 | Fukunaga ...................... 361/93.7 |
| 5,396,117 | A | * | 3/1995 | Housen et al. ................ 327/480 |
| 5,621,601 | A | | 4/1997 | Fujihira et al. |
| 5,710,508 | A | * | 1/1998 | Watanabe ......................... 361/18 |
| 5,999,041 | A | * | 12/1999 | Nagata et al. ................. 361/91.5 |
| 6,180,966 | B1 | | 1/2001 | Kohno et al. |
| 6,594,131 | B2 | * | 7/2003 | Umekawa ...................... 361/93.1 |
| 6,717,785 | B2 | * | 4/2004 | Fukuda et al. ............... 361/93.1 |
| 6,842,064 | B2 | * | 1/2005 | Yamamoto .................... 361/93.1 |
| 7,957,115 | B2 | * | 6/2011 | Higashi ......................... 361/93.7 |
| 8,072,241 | B2 | * | 12/2011 | Kouno .......................... 327/480 |
| 2002/0141126 | A1 | * | 10/2002 | Tabata .......................... 361/93.7 |
| 2006/0215341 | A1 | | 9/2006 | Sakurai et al. |
| 2008/0100978 | A1 | | 5/2008 | Maebara et al. |
| 2009/0057832 | A1 | | 3/2009 | Kouno |

FOREIGN PATENT DOCUMENTS

| JP | 64-066970 | | 3/1989 |
| JP | 02-130951 | A | 5/1990 |
| JP | 05-259853 | A | 10/1993 |
| JP | 07-146722 | A | 6/1995 |
| JP | 09-172359 | A | 6/1997 |
| JP | 10-032476 | A | 2/1998 |
| JP | 10-326897 | A | 12/1998 |
| JP | 11-235015 | A | 8/1999 |

(Continued)

*Primary Examiner* — Jue Zhang
(74) *Attorney, Agent, or Firm* — Rabin & Berdo, P.C.

(57) ABSTRACT

A small power semiconductor device current detector circuit and detection method with low loss by detecting current using the sensing function of a power semiconductor device is disclosed. An already known current is caused to flow through a main region of the power semiconductor device. The current is detected by a current detector unit connected to a sense terminal of the power semiconductor device. A deviation in characteristics between the main region and a sensing region is detected by a variable voltage source circuit based on the detected current. An offset amount and gain amount in an output regulator are regulated in such a way that the characteristics of the two coincide. The offset amount and gain amount to be regulated may be supplied to the output regulator, serially or in parallel, from a CPU provided externally.

9 Claims, 19 Drawing Sheets

(56) References Cited

FOREIGN PATENT DOCUMENTS

| JP | 2000-134955 A | 5/2000 |
|----|---------------|--------|
| JP | 2003-274667 A | 9/2003 |
| JP | 2005-050913 A | 2/2005 |
| JP | 2006-211834 A | 8/2006 |
| JP | 2006-271098 A | 10/2006 |
| JP | 2007-049870 A | 2/2007 |
| JP | 2007-194660 A | 8/2007 |
| JP | 2008-005217 A | 1/2008 |
| JP | 2008-136335 A | 6/2008 |
| JP | 2009-268336 A | 11/2009 |
| JP | 2010-004728 A | 1/2010 |
| JP | 2010-199279 A | 9/2010 |

* cited by examiner

SYMBOLIC CIRCUIT

EQUIVALENT CIRCUIT

POWER SEMICONDUCTOR DEVICE CURRENT DETECTOR CIRCUIT AND DETECTION METHOD

BACKGROUND OF THE INVENTION

1. Technical Field

The present invention relates to a power semiconductor device current detector circuit and detection method, and in particular, relates to a current detector circuit and detection method that detect a current flowing through a power semiconductor device such as a diode, thyristor, transistor (bipolar transistor or metal oxide semiconductor field effect transistor (MOSFET)), or insulated gate bipolar transistor (IGBT).

2. Related Art

An IGBT module in which are mounted an IGBT, which is one kind of power semiconductor device, and a free wheeling diode (hereafter called an FWD) is applied to a power conversion device such as an inverter or direct current (DC) chopper circuit.

Generally, an output current detection is necessary in order to control these power conversion circuits. Normally, two methods are widely employed in the output current detection, which are 1: a method using a current detector such as a current transformer or direct current current transformer (DCCT), and
2: a method using a current detecting resistor (called a shunt resistor).

FIG. 9 is a diagram showing an example of a configuration of a heretofore known three-phase inverter device in which a DCCT is used. The DCCT (also called a direct current current transformer) utilizes a ring-like core and a Hall element, which is a magnetic sensor, as shown in JP-A-2000-134955 (FIGS. 1 and 18 of JP-A-2000-134955) shown below. Wiring is passed through the core, and the current is detected by detecting magnetism generated when current is passed through the wiring. In an inverter 101 shown in FIG. 9, the DCCT 105 is installed on the output wiring, and the detected current value is input into a control circuit 102.

FIG. 10 is a diagram showing an example of a configuration of a heretofore known three-phase inverter device in which a shunt resistor is used. A shunt resistor 106 is connected in the lower arm of the inverter 101 shown in FIG. 10. As an output current flows through the lower arm at a timing at which an IGBT 201 of the lower arm comes on, the output current is detected by detecting a voltage drop of the shunt resistor 106 at this time in the control circuit 102. A current detector circuit in which the shunt resistor is used is shown in, for example, JP-A-2003-274667 (FIGS. 1, 4, and 7 of JP-A-2003-274667) shown below.

FIG. 11 is a diagram showing an example of a configuration of a heretofore known chopper circuit in which a shunt resistor is used. The shunt resistor 106 is connected to a ground (GND) line, as shown in FIG. 11, and the voltage drop of the resistor 106 is detected. By detecting the current in this place, the control circuit 102 can detect a current when there is a boost chopper action from a direct current power source 103 in the direction of an aluminum electrolytic capacitor 108, and a current when there is a step down chopper action from the aluminum electrolytic capacitor 108 in the direction of the direct current power source 103.

The heretofore known current detection methods have the kinds of problem indicated below. That is, with the current detection method in which a DCCT is used shown in FIG. 9, there are problems in that the price is generally high because the DCCT uses a Hall sensor and a core, and that the output characteristics of the DCCT change due to the ambient temperature. Also, there is a problem in that the size of the detector increases because a core is used, and this restricts the miniaturization of the power conversion device.

Also, with the current detection method in which a shunt resistor is used shown in FIG. 10, there is a problem in that, as power loss occurs due to the shunt resistor, the power conversion efficiency of the power conversion device decreases. Furthermore, there is a problem in that the size of the resistor itself increases in order to tolerate a large loss, and this restricts the miniaturization of the conversion device.

However, there are cases in which a current detecting function called a "sensing function-equipped power semiconductor device" is installed in a diode, thyristor, transistor, or the like, which are power semiconductor devices. For example, among IGBTs or FWDs configuring an inverter device, there are ones called "sense IGBTs" and "sense FWDs" equipped with a current detecting function. Hereafter, the function will be described with a "sense IGBT" as an example.

Normally, an IGBT is configured of a few thousand to a few tens of thousands of cells of the same structure. One portion of these is utilized as current detecting cells. In this case, an IGBT formed from the current detecting portion of the cells is called a "sensing region", and an IGBT formed from the other cells a "main region". Then, generally, it is often the case that a ratio Nm/Ns between a main region cell quantity Nm (Nm is an integer) and a sensing region cell quantity Ns (Ns is an integer) is set at a few thousand to one. Although the main region and sensing region share a collector terminal, emitter terminals are divided into a main emitter terminal (hereafter called a main terminal) and a current detecting emitter terminal (hereafter called a sense terminal). An IGBT with this kind of configuration is represented by the kind of symbolic circuit shown in FIG. 13A. Also, an equivalent circuit thereof is represented as in FIG. 13B.

In the case of a free wheeling diode (FWD) too, one portion of the chip is divided off for current detecting in the same way, and anode terminals are divided into a main anode terminal (hereafter, a main terminal) and a current detecting anode terminal (hereafter, a sense terminal).

With an existing intelligent power module (IPM), an example has been reported wherein the function of the sense IGBT is used for detecting an overcurrent. That is, in JP-A-10-32476 (FIGS. 8 and 9 of JP-A-10-32476) shown below, it is determined that an overcurrent is flowing through the main region when the current flowing through the sensing region exceeds a predetermined value.

Technologies of detecting current utilizing the sensing region are also proposed in JP-A-2000-134955 (FIGS. 1 and 18 of JP-A-2000-134955) and JP-A-2003-274667 (FIGS. 1, 4, and 7 of JP-A-2003-274667) shown below. These technologies will be described using FIG. 12.

In principle, a current in accordance with the ratio Nm/Ns between the cell quantities flows through the sense terminal (refer to Equation 1).

$$Im/Is = (Nm+Ns)/Ns \approx Nm/Ns \qquad \text{(Equation 1)}$$

Herein, Im is the main current (the current flowing through the main IGBT), Is is the sense current (the current flowing through the sense IGBT), Nm is the main region cell quantity, and Ns is the sensing region cell quantity.

Therefore, a shunt resistor Rs is connected to the sense terminal as in FIG. 12, a sense current Is is detected, and the main current is calculated based on Equation 2 below.

$$Im = (Nm/Ns) \times Is \quad \text{(Equation 2)}$$
$$= (Nm/Ns) \times (Vs/Rs)$$

Although there has been a problem in that resistor loss increases when detecting the main current Im with the shunt resistor Rs, with this method, the shunt resistor loss is small, and consequently, the problems of a decrease inefficiency and an increase in size of the resistor are eliminated.

However, with this method, current detecting accuracy is a problem. That is, in general, a current detecting accuracy of one to two percent is required in an inverter control. However, as the accuracy is low, the method using the sensing region cannot be put to practical use.

Two reasons for the accuracy being low will now be discussed. The first reason involves a factor caused by differences in characteristics between the main region and sensing region. That the current ratio is proportional to the cell quantity ratio is based on the premise that the characteristics of each cell of the main region and sensing region are the same. However, as there is actually variation in the characteristics, the ratio between the main current and sense current is not constant. When illustrating this on a graph, the relationship between the main current and sense current is not linear (refer to the characteristics before correction in FIG. 14).

It can be thought that the difference in characteristics is approximately the difference between threshold voltages Vthm0 and Vths0, and between internal resistances Rm0 and Rs0, of each IGBT.

The second reason for the accuracy being low involves a factor caused by the effect of the shunt resistor. A voltage drop occurs when a current flows through the shunt resistor Rs connected to the sense terminal. For this reason, a difference occurs between the main terminal potential and sense terminal potential, and the ratio between the main current and sense current is not constant.

SUMMARY OF THE INVENTION

Bearing in mind the problems of the related art, the invention has an object of solving at least the three problems shown below. That is, 1. to reduce an increase in size and increase in loss of the current detector when using a direct current current transformer (DCCT) or shunt resistor (for detecting the main current).
2. To ensure that no decrease in current detection accuracy occurs when utilizing a sensing function-equipped power semiconductor device.
3. To achieve a digital control of a correction circuit that improves the current detection accuracy of the sensing function-equipped power semiconductor device, and a suppression of the circuit scale.

More specifically, the object is at least to a: to realize a small current detector circuit with low loss by detecting current using the sensing function of a sensing function-equipped power semiconductor device.

b: In this case, to correct the linearity of the main current Im and sense current Is, and improve the current detection accuracy.

c: To enable a digital control of a correction circuit that corrects the linearity, with a realizable circuit scale.

In order to achieve the object, a configuration principle of a power semiconductor device current detector circuit of the invention, taking the difference in characteristics between a main region and sensing region to be due to the difference between a threshold voltage and internal resistance of each IGBT, is that the current detector circuit is configured in such a way as to correct the difference between the threshold voltage and internal resistance of each IGBT.

Specifically, the current detector circuit is configured in such a way that an already known current is caused to flow through the main region, the current is detected from a sense terminal, and a gain and offset are regulated in order to correct the difference in characteristics between the main region and sensing region in accordance with the detected current. More specifically, the current detector circuit is configured in such a way that an already known current is caused to flow through the main region of the power semiconductor device, the current is detected by a current detector unit connected to a sense terminal of the power semiconductor device, a deviation in characteristics between the main region and sensing region is detected based on the detected current, and an offset amount and gain amount in an output regulator are regulated in such a way that the characteristics of the two coincide.

Also, the current detector circuit is configured in such a way that a parameter Kg that corrects a difference in internal resistance, and a parameter Ko that corrects a difference in internal threshold voltage, are set as correction parameters for improving the current detection accuracy of the semiconductor device, and the parameters can be changed from the exterior by a digital signal passing through a serial or parallel signal supply unit.

Furthermore, an inverter device or chopper circuit configured to include an IGBT and FWD in upper arm and lower arm switching elements is configured in such a way that the IGBT provided in the upper arm is a sensing function-equipped IGBT and the FWD provided in the lower arm is a sensing function-equipped FWD, and the heretofore described current detector circuit is connected to the sense terminals of the sensing function-equipped IGBT and sensing function-equipped FWD.

According to the invention, it is possible to correct the sense characteristics of a sensing function-equipped power semiconductor device, and a highly accurate main current calculation is possible utilizing the sensing function. As the main current detection is carried out using the sensing function in this way, it is possible to realize a miniaturization and decrease in loss of the current detector when compared with the heretofore known methods using a direct current transformer (DCCT) or shunt resistor (for detecting the main current).

Also, according to the invention, as the setting of the correction parameters can be carried out from the exterior using a serial or parallel signal supply unit, it is possible to realize an application circuit in which the current detector circuit of the invention is mounted in an appropriate circuit scale.

Also, by applying the current detector circuit of the invention in the lower arm of an inverter device or the lower arm of a chopper circuit, it is possible to accurately detect the output current of the inverter device or chopper circuit.

DETAILED DESCRIPTION

Hereafter, a detailed description will be given of an embodiment of the invention.

A configuration principle of a power semiconductor device current detector circuit of the invention, taking the difference in characteristics between a main region and sensing region to be due to the difference between a threshold voltage and internal resistance of each IGBT, is that the current detector circuit is configured in such a way as to correct the difference between the threshold voltage and internal resistance of each IGBT. Specifically, the current detector circuit is configured in such a way that an already known current is caused to flow through the main region, the current is detected from a sense terminal, and a gain and offset are regulated in order to correct the difference in characteristics between the main region and sensing region in accordance with the detected current. More specifically, the current detector circuit is configured in such a way that an already known current is caused to flow through the main region of the power semiconductor device, the current is detected by a current detector unit connected to a sense terminal of the power semiconductor device, a deviation in characteristics between the main region and sensing region is detected based on the detected current, and an offset amount and gain amount in an output regulator are regulated in such a way that the characteristics of the two coincide. A detailed description of this will be given hereafter. By so doing, it is possible to realize a small current detector circuit with low loss.

Next, a detailed description will be given of the power semiconductor device current detector circuit according to the embodiment of the invention, but first, a description will be given of a basic configuration of the current detector circuit of the invention, and after that, a description will be given of specific configurations (working examples).

Figure 1A:
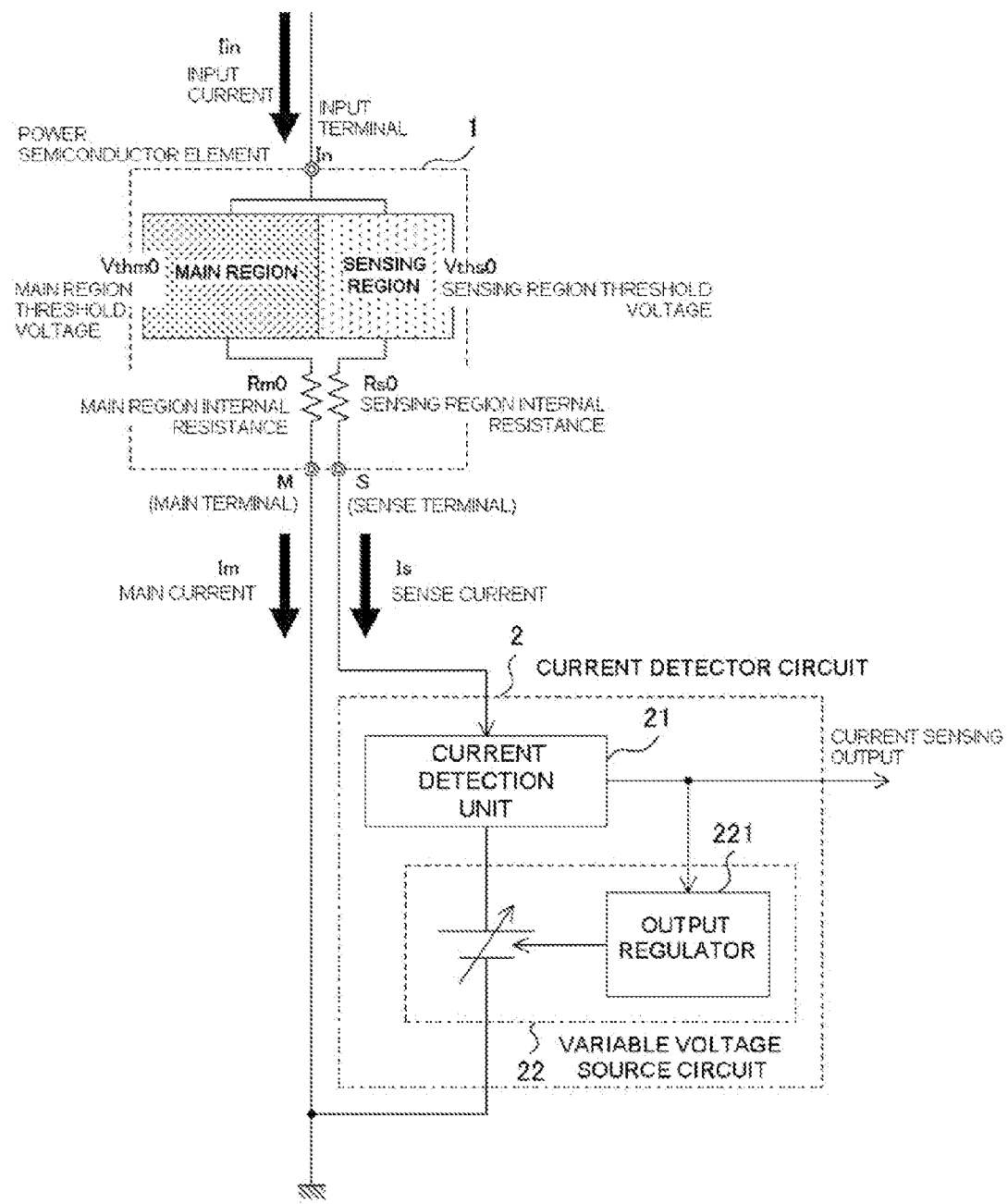
FIGS. 1A and 1B are diagrams showing a first configuration principle of a power semiconductor device current detector circuit according to an embodiment of the invention.
Figure 1B:
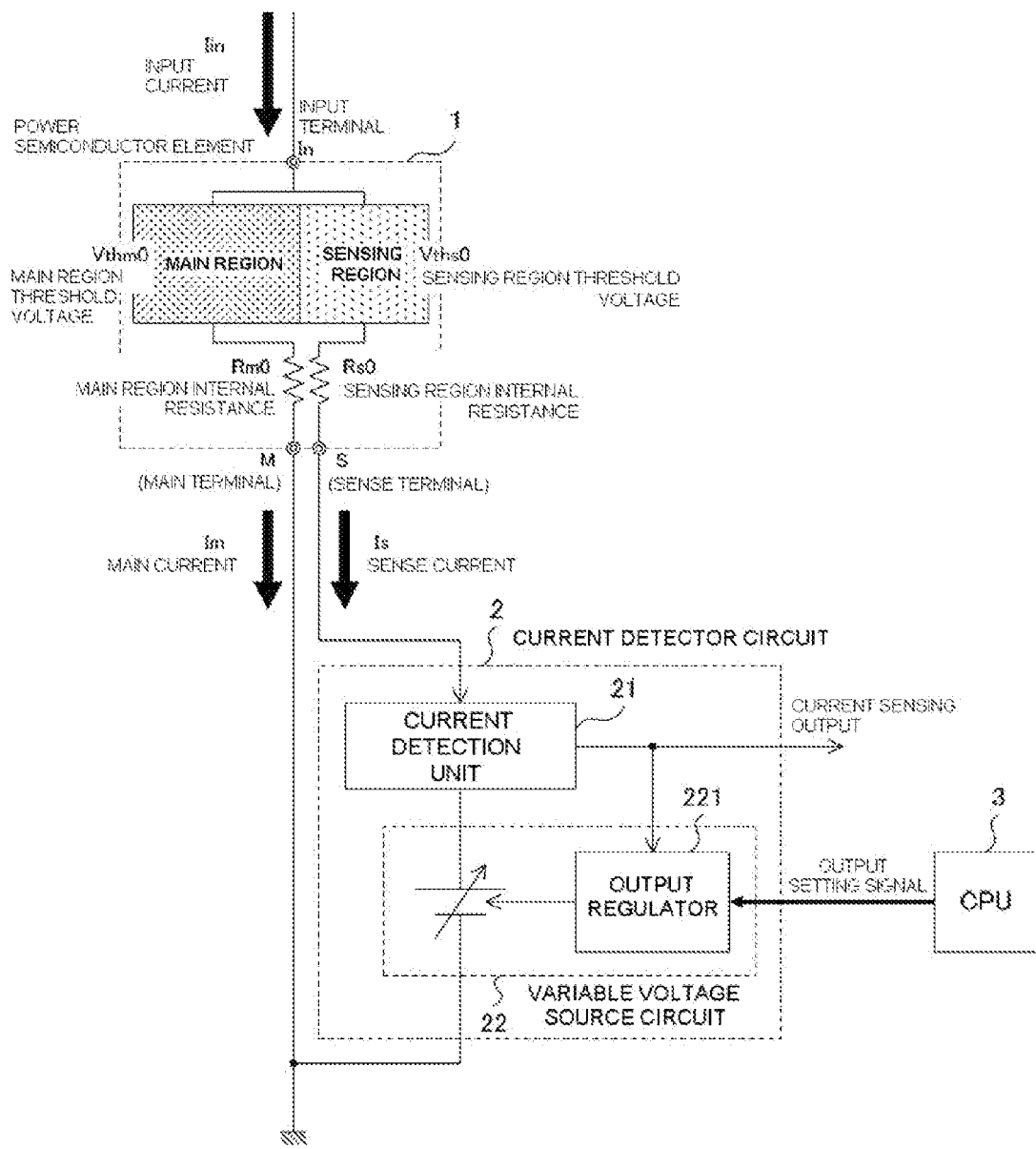
Figure 13A:
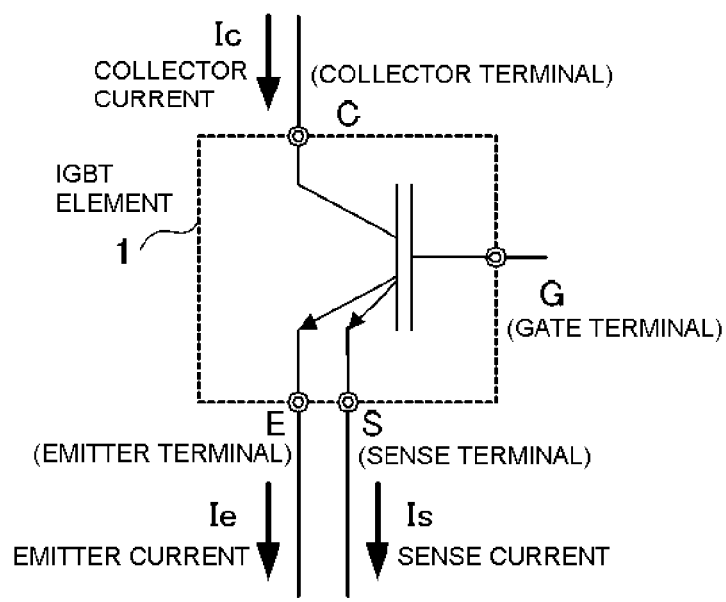
FIGS. 13A and 13B are diagrams showing a symbolic circuit and equivalent circuit of a sensing function-equipped semiconductor device (for example, an IGBT)
Figure 13B:
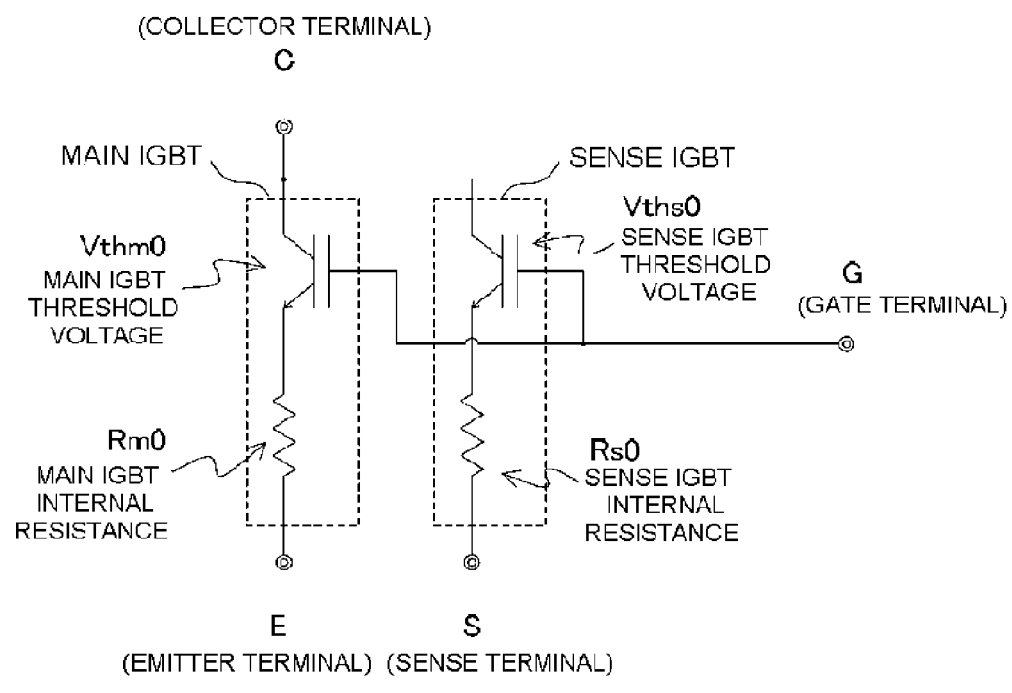

FIGS. 1A and 1B are diagrams showing a first configuration principle of the power semiconductor device current detector circuit according to the embodiment of the invention. In FIG. 1A, a power semiconductor device current detector circuit 2 according to the embodiment of the invention is configured of a current detection unit 21 and a variable voltage source circuit 22. Then, the current detection unit 21 and variable voltage source circuit 22 are connected in series. Also, the current detector circuit 2 is connected between a sense terminal S and a main terminal M of a sensing function-equipped power semiconductor element 1 shown in an upper portion of FIG. 1A. The configuration of the sensing function-equipped power semiconductor element 1 shown in the upper portion of FIG. 1A is basically the same as that shown in FIGS. 13A and 13B. A current sensing output, which is current information detected by the current detection unit 21, is input into an output regulator 221 that regulates the output voltage of the variable voltage source circuit 22.

By configuring in this way, it is possible to fix the potential of the sense terminal S at the output voltage of the variable voltage source circuit 22. Supposing that the output of the variable voltage source circuit 22 is 0V, it is possible to fix the potential of the sense terminal S at a ground (GND) potential, regardless of the size of a current flowing as a sense current Is. That is, it is possible to eliminate the effect of a shunt resistor voltage drop, which is a problem with the heretofore known technology.

Furthermore, a gain Kg and offset Ko are set by the output regulator 221 in such a way that the output voltage of the variable voltage source circuit 22 is changed in accordance with the current detected by the current detection unit 21. Herein, Kg is set as a parameter correcting a difference in internal resistance, and Ko as a parameter correcting a difference in internal threshold voltage. By so doing, a voltage Vs of the sense terminal S changes in accordance with the current flowing, as follows:

$$Vs = Kg \times Is + Ko$$

Herein, Kg is the gain, and Ko the offset. As the gain Kg and offset Ko function as a simulated resistance and offset voltage respectively, it is possible to correct a difference in characteristics between the main region and sensing region by regulating so that $$Rm0 \approx Rs0 + Kg$$

$$Vthm0 \approx Vths0 + Ko$$

Herein, $Rm0$ is the internal resistance of the main region, $Rs0$ is the internal resistance of the sensing region, $Vthm0$ is the threshold voltage of the main region, and $Vths0$ is the threshold voltage of the sensing region. The gain Kg and offset Ko can be set to either a positive or negative polarity.

Also, as shown in FIG. 1B, it is also possible to set the gain Kg and offset Ko to a positive or negative polarity using a digital signal (output setting signal) output from a central processing unit (CPU) 3 provided externally. The output setting signal output from the CPU 3 is applied to the output regulator 221 in a serial form or parallel form.

Figure 2A:
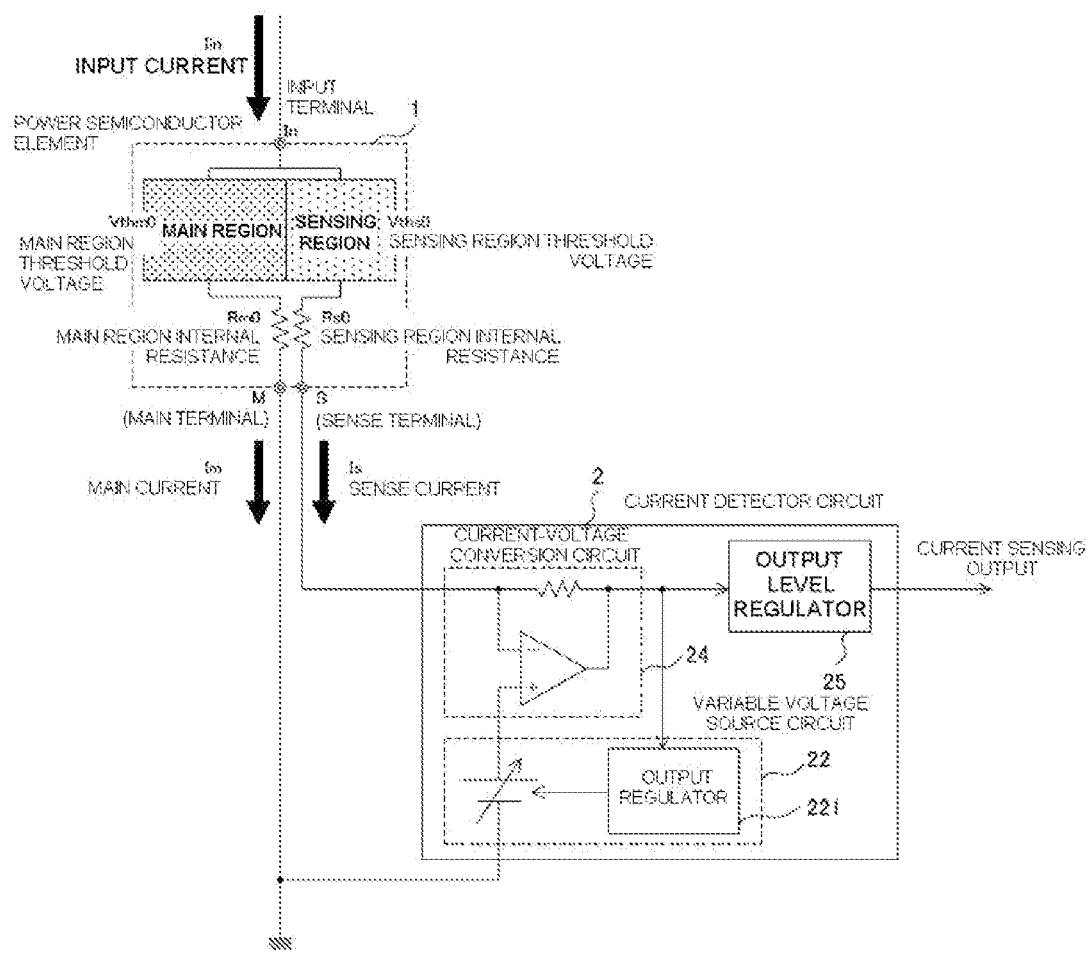
FIGS. 2A and 2B are diagrams showing a second configuration principle of the power semiconductor device current detector circuit according to the embodiment of the invention.
Figure 2B:
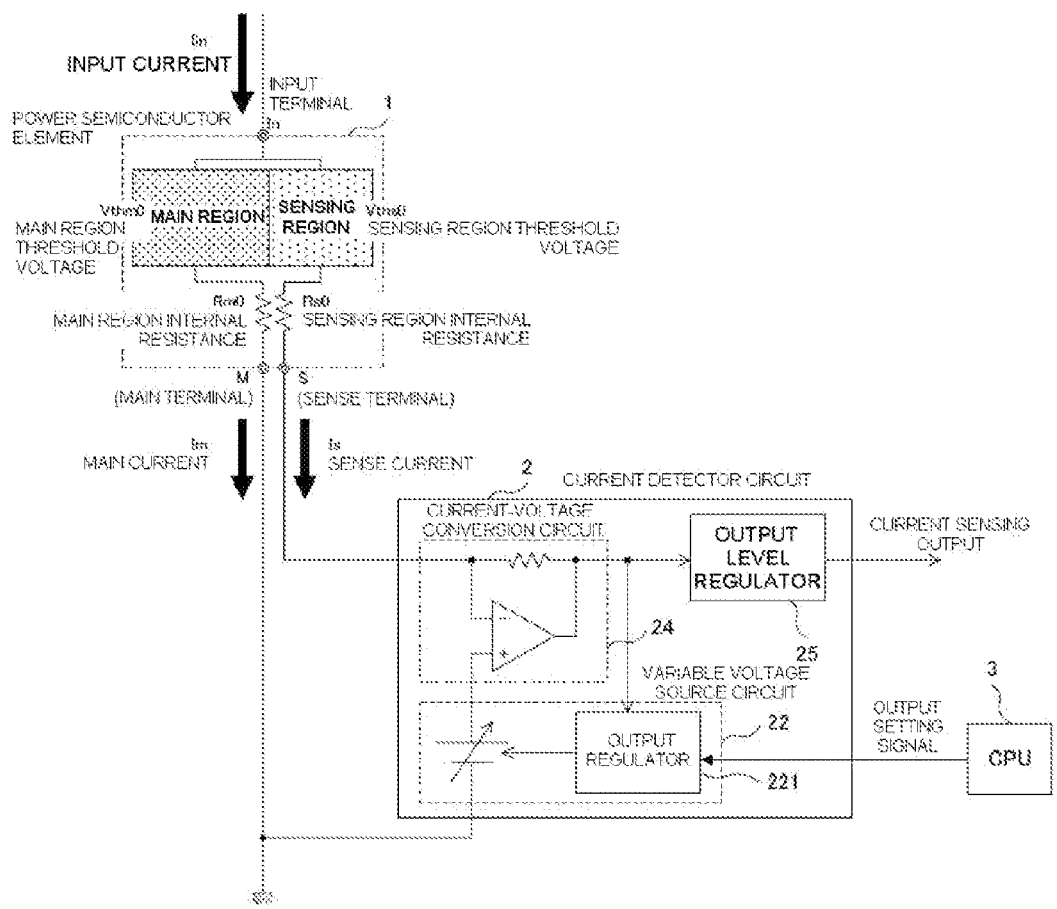

FIGS. 2A and 2B are diagrams showing a second configuration principle of the power semiconductor device current detector circuit according to the embodiment of the invention.

In FIG. 2A, the power semiconductor device current detector circuit 2 according to the embodiment of the invention is configured of a current-voltage conversion circuit 24, the variable voltage source circuit 22, and an output level regulator 25. Then, the current-voltage conversion circuit 24 and variable voltage source circuit 22 are connected in series. Also, the current detector circuit 2 is connected between the sense terminal S and main terminal M of the sensing function-equipped power semiconductor element 1 shown in an upper portion of FIG. 2A. Furthermore, the output of the current-voltage conversion circuit 24 is input into the output regulator 221 of the variable voltage source circuit 22. Also, the input side of the output level regulator 25 is connected to the output side of the current-voltage conversion circuit 24. The configuration of the sensing function-equipped power semiconductor element 1 shown in the upper portion of FIG. 2A is basically the same as that shown in FIGS. 13A and 13B.

By configuring in this way, it is possible to fix the potential of the sense terminal S at the output voltage of the variable voltage source circuit 22 (because the negative terminal and positive terminal of the operational amplifier are virtually short-circuited). Supposing that the output voltage of the variable voltage source circuit 22 is 0V, it is possible to fix the potential of the sense terminal S at the GND potential, regardless of the size of the current flowing as the sense current Is. That is, it is possible to eliminate the effect of a shunt resistor voltage drop, which is a problem with the heretofore known technology.

Furthermore, the gain Kg and offset Ko are set by the output regulator 221 in such a way that the output voltage of the variable voltage source circuit 22 is changed in accordance with the current detected by the current-voltage conversion circuit 24. As heretofore described, Kg is set as a parameter correcting a difference in internal resistance, and Ko as a parameter correcting a difference in internal threshold voltage. By so doing, the voltage Vs of the sense terminal S changes in accordance with the current flowing, as follows:

$$Vs = Kg \times Is + Ko$$

Herein, Kg is the gain, and Ko the offset. As the gain Kg and offset Ko function as a simulated resistance and offset voltage respectively, it is possible to correct a difference in characteristics between the main region and sensing region by regulating so that $$Rm0 \approx Rs0 + Kg$$

$$Vthm0 \approx Vths0 + Ko$$

Herein, Rm0 is the internal resistance of the main region, Rs0 is the internal resistance of the sensing region, Vthm0 is the threshold voltage of the main region, and Vths0 is the threshold voltage of the sensing region. The gain Kg and offset Ko can be set to either a positive or negative polarity.

Also, as shown in FIG. 2B, it is also possible to set the gain Kg and offset Ko to a positive or negative polarity using a digital signal (output setting signal) output from the CPU 3 provided externally. The output setting signal output from the CPU 3 is applied to the output regulator 221 in a serial form or parallel form.

Figure 3A:
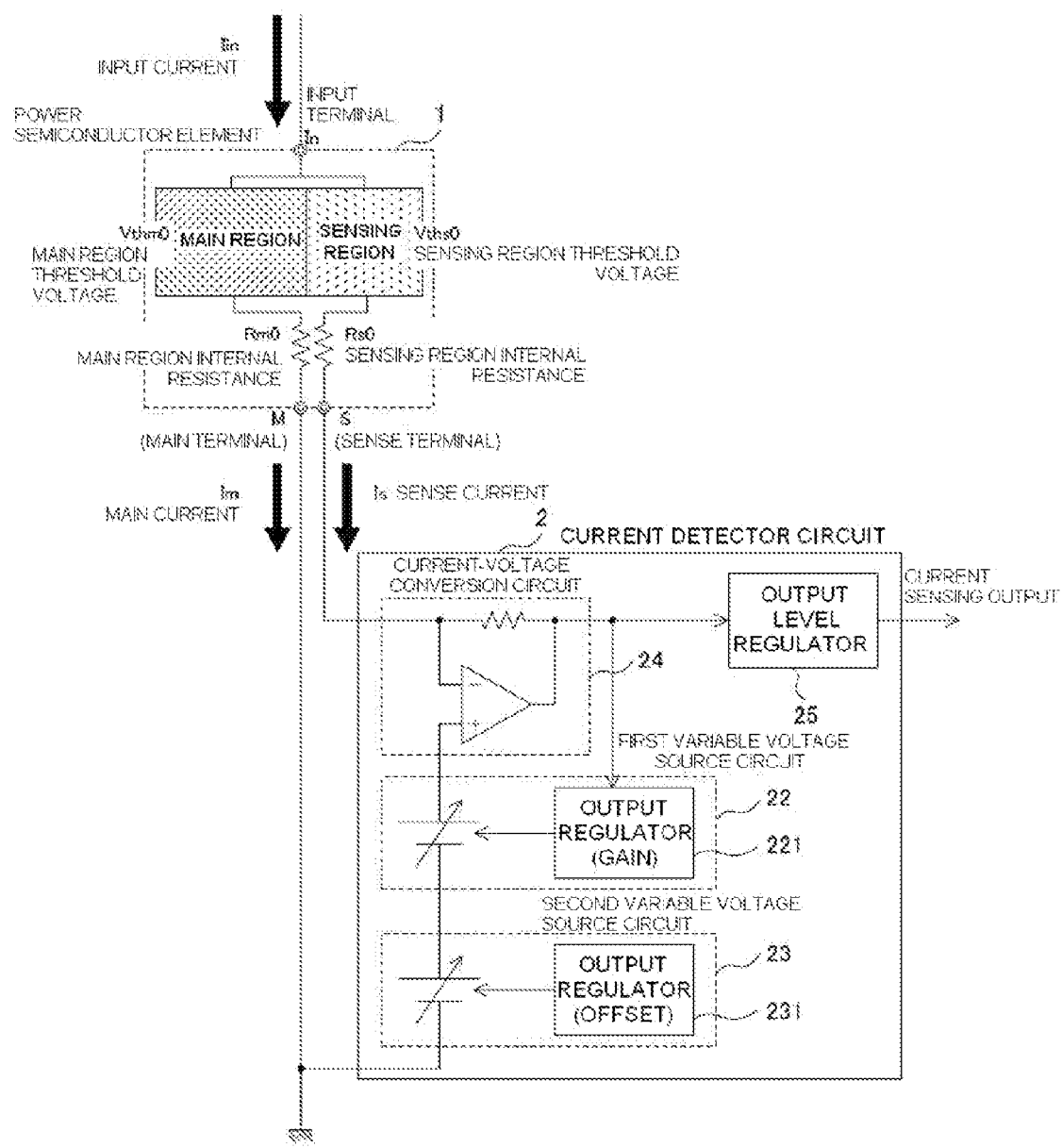
FIGS. 3A and 3B are diagrams showing a third configuration principle of the power semiconductor device current detector circuit according to the embodiment of the invention.
Figure 3B:
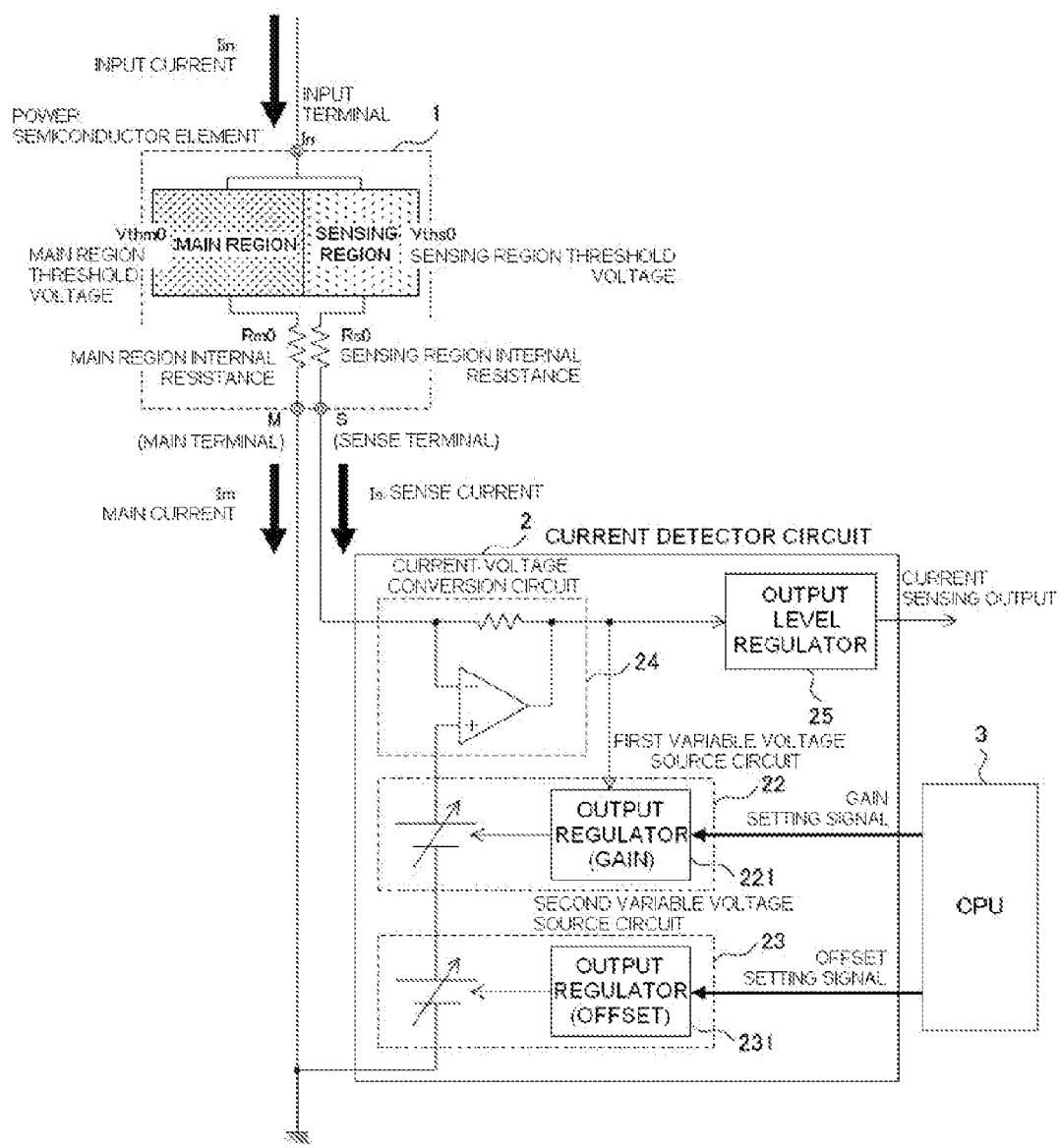

FIGS. 3A and 3B are diagrams showing a third configuration principle of the power semiconductor device current detector circuit according to the embodiment of the invention. In FIG. 3A, the power semiconductor device current detector circuit 2 according to the embodiment of the invention is configured of the current-voltage conversion circuit 24, the first variable voltage source circuit 22, a second variable voltage source circuit 23, and the output level regulator 25. The current-voltage conversion circuit, first variable voltage source circuit, and second variable voltage source circuit are connected in series. Also, the current detector circuit 2 is connected between the sense terminal S and main terminal M of the sensing function-equipped power semiconductor element 1 shown in an upper portion of FIG. 3A. Furthermore, the output of the current-voltage conversion circuit 24 is input into the output (gain) regulator 221 of the first variable voltage source circuit 22. Also, the input side of the output level regulator 25 is connected to the output side of the current-voltage conversion circuit 24. The configuration of the sensing function-equipped power semiconductor element 1 shown in the upper portion of FIG. 3A is basically the same as that shown in FIGS. 13A and 13B.

By configuring in this way, it is possible to fix the potential of the sense terminal S at a voltage wherein the output voltages of the first variable voltage source circuit 22 and second variable voltage source circuit 23 are combined (because the negative terminal and positive terminal of the operational amplifier are virtually short-circuited). Supposing that the voltage wherein the output voltages of the first variable voltage source circuit 22 and second variable voltage source circuit 23 are combined is 0V, it is possible to fix the potential of the sense terminal S at the GND potential, regardless of the size of the current flowing as the sense current Is. That is, it is possible to eliminate the effect of a shunt resistor voltage drop, which is a problem with the heretofore known technology.

Furthermore, the gain Kg is set by the output (gain) regulator 221 in such a way that the output voltage of the first variable voltage source circuit 22 is changed in accordance with the current detected by the current-voltage conversion circuit 24, and the offset Ko is set by an output (offset) regulator 231 in such a way that the output voltage of the second variable voltage source circuit 23 is changed. As heretofore described, Kg is set as a parameter correcting a difference in internal resistance, and Ko as a parameter correcting a difference in internal threshold voltage. By so doing, the voltage Vs of the sense terminal S changes in accordance with the current flowing, as follows:

$$Vs = Kg \times Is + Ko$$

Herein, Kg is the gain, and Ko the offset. As the gain Kg and offset Ko function as a simulated resistance and offset voltage respectively, it is possible to correct a difference in characteristics between the main region and sensing region by regulating so that $$Rm0 \approx Rs0 + Kg$$

$$Vthm0 \approx Vths0 + Ko$$

Herein, Rm0 is the internal resistance of the main region, Rs0 is the internal resistance of the sensing region, Vthm0 is the threshold voltage of the main region, and Vths0 is the threshold voltage of the sensing region. The gain Kg and offset Ko can be set to either a positive or negative polarity.

Also, as shown in FIG. 3B, it is also possible to set the gain Kg and offset Ko to a positive or negative polarity using a digital signal (output setting signal) output from the CPU 3 provided externally. The output setting signal output from the CPU 3 is applied to the output (gain) regulator 221 and output (offset) regulator 231 in a serial form or parallel form.

Figure 4A:
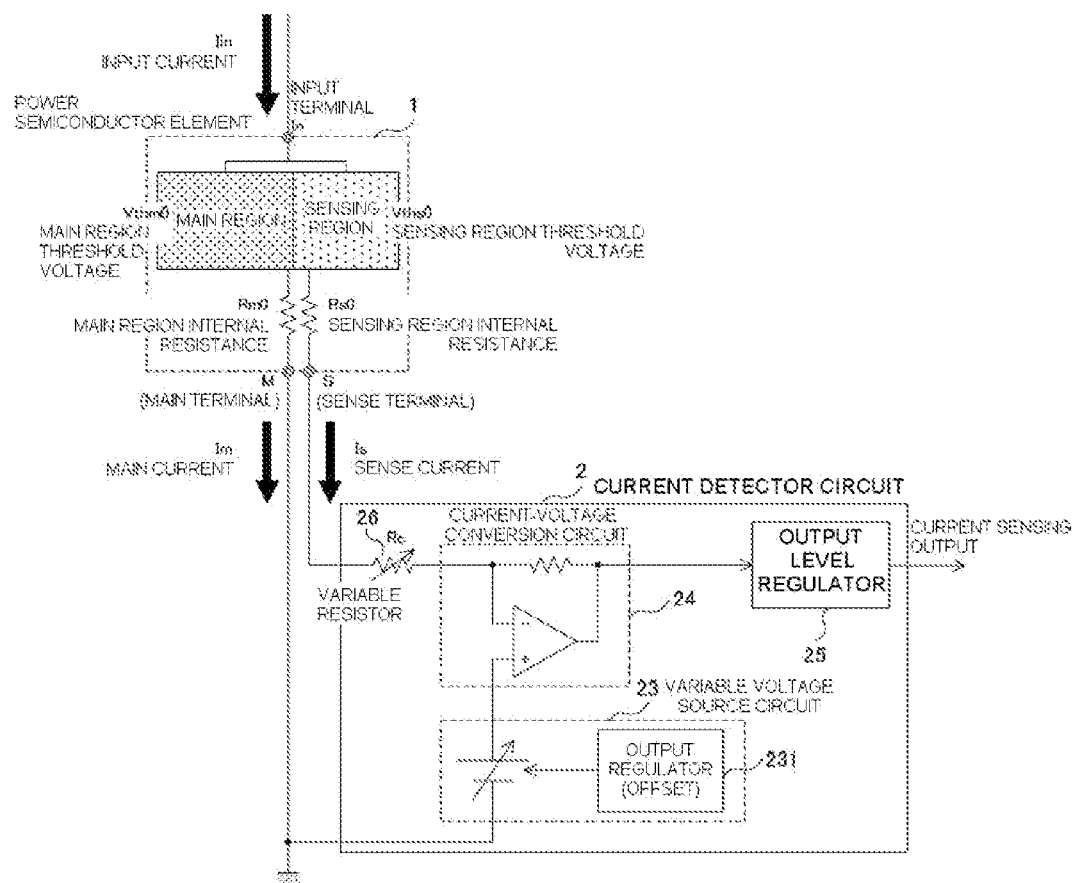
FIGS. 4A and 4B are diagrams showing a fourth configuration principle of the power semiconductor device current detector circuit according to the embodiment of the invention.
Figure 4B:
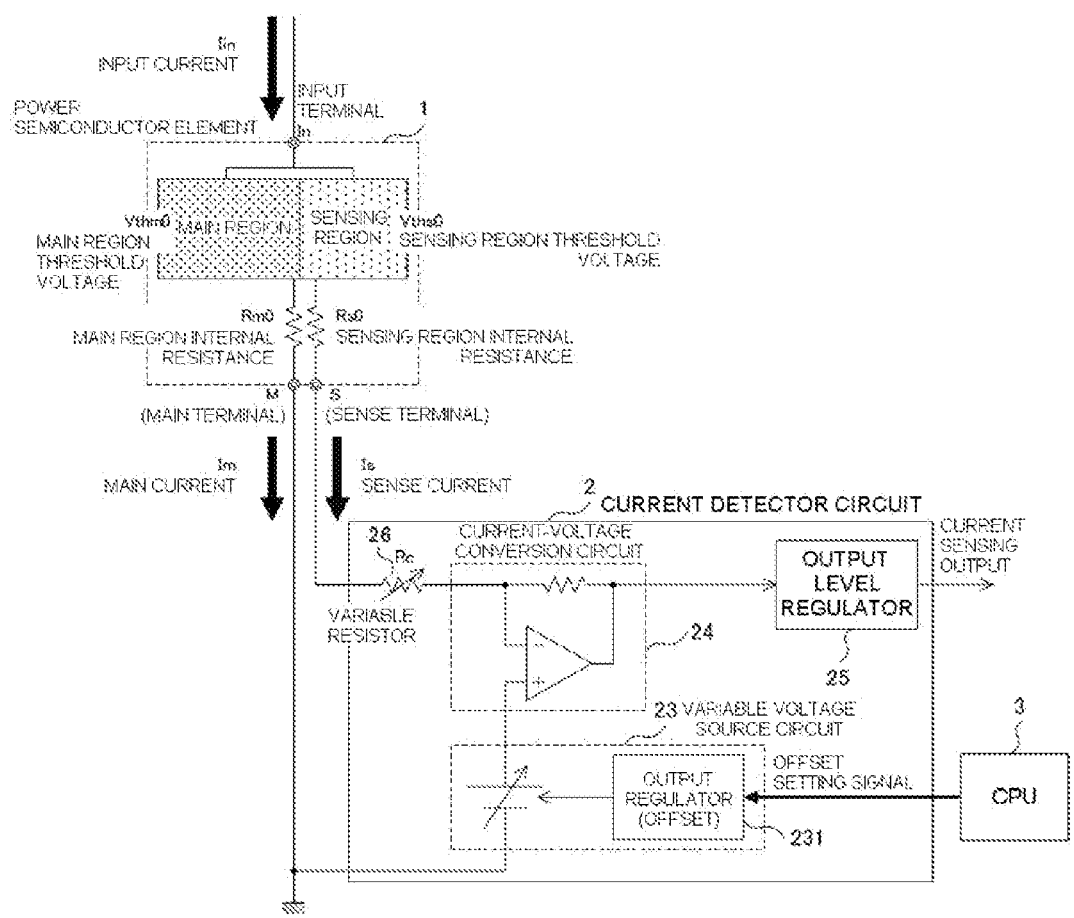

FIGS. 4A and 4B are diagrams showing a fourth configuration principle of the power semiconductor device current detector circuit according to the embodiment of the invention. In FIG. 4A, the power semiconductor device current detector circuit 2 according to the embodiment of the invention is configured of the current-voltage conversion circuit 24, the variable voltage source circuit 23, a variable resistor 26, and the output level regulator 25.

The variable resistor 26, current-voltage conversion circuit 24, and variable voltage source circuit 23 are connected in series. Also, the current detector circuit 2 is connected between the sense terminal S and main terminal M of the sensing function-equipped power semiconductor element 1 shown in an upper portion of FIG. 4A. Furthermore, the input side of the output level regulator 25 is connected to the output side of the current-voltage conversion circuit 24. The configuration of the sensing function-equipped power semiconductor element 1 shown in the upper portion of FIG. 4A is basically the same as that shown in FIGS. 13A and 13B.

By configuring in this way, the offset Ko of the output (offset) regulator 231 is set for the output voltage of the variable voltage source circuit 23, and furthermore, for a resistance value Rc of the variable resistor 26. Herein, Ko is set as a parameter correcting a difference in internal threshold voltage. By so doing, the voltage Vs of the sense terminal S changes in accordance with the current flowing, as follows:

$$Vs = Rc \times Is + Ko$$

Herein, Rc is the resistance value of the variable resistor, and Ko the offset. As the resistance Rc and offset Ko function as a resistance and simulated offset voltage respectively, it is possible to correct a difference in characteristics between the main region and sensing region by regulating so that $$Rm0 \approx Rs0 + Rc$$

$$Vthm0 \approx Vths0 + Ko$$

Herein, Rm0 is the internal resistance of the main region, Rs0 is the internal resistance of the sensing region, Vthm0 is the threshold voltage of the main region, and Vths0 is the threshold voltage of the sensing region. The offset Ko can be set to either a positive or negative polarity.

Also, as shown in FIG. 4B, it is also possible to set the offset Ko to a positive or negative polarity using a digital signal (offset setting signal) output from the CPU 3 provided externally. The offset setting signal output from the CPU 3 is applied to the output regulator 231 in a serial form or parallel form.

Figure 5:
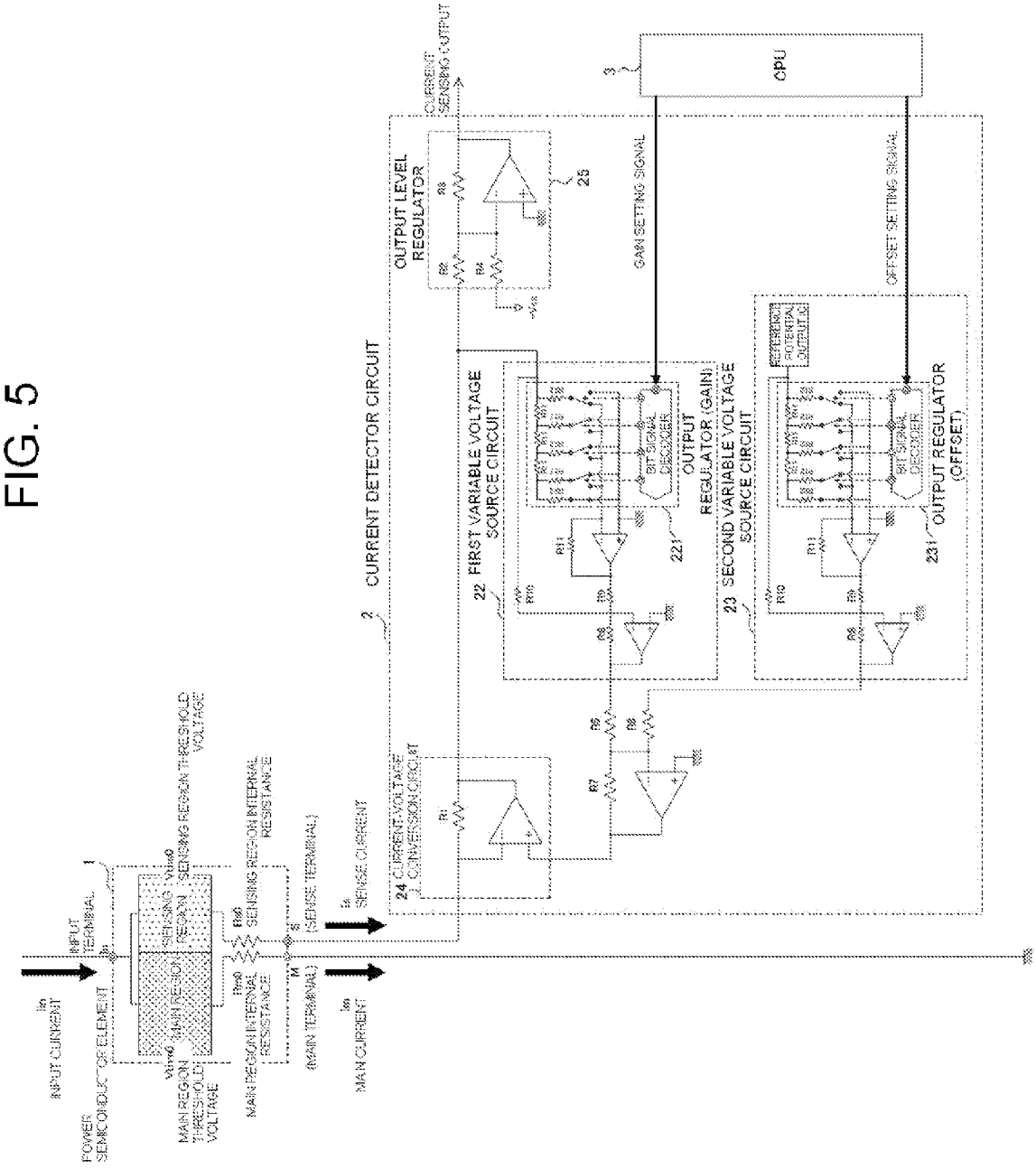
FIG. 5 is a diagram showing a first working example of the power semiconductor device current detector circuit according to the embodiment of the invention.

FIG. 5 is a diagram showing a first working example of the power semiconductor device current detector circuit according to the embodiment of the invention. The third configuration principle of the power semiconductor device current detector circuit according to the embodiment of the invention shown in FIGS. 3A and 3B is realized in FIG. 5.

In the first working example of the invention shown in FIG. 5, the power semiconductor device current detector circuit according to the embodiment of the invention is configured of the current-voltage conversion circuit 24, the first variable voltage source circuit 22, the second variable voltage source circuit 23, and the output level regulator 25.

The first variable voltage source circuit 22 is configured of two inverting amplifiers and the output (gain) regulator 221. The output (gain) regulator 221 is configured of a ladder circuit and a bit signal decoder that carries out a switching in accordance with a bit setting by a digital signal (an example of a 4-bit resolution is shown in the diagram). The second variable voltage source circuit 23 is of a configuration wherein a reference potential output integrated circuit (IC) is added to the configuration of the first variable voltage source circuit 22. The output voltages of the first variable voltage source circuit 22 and second variable voltage source circuit 23 are added together by an adder circuit (including an operational amplifier and resistors R5 to R7), and connected to a reference potential terminal (positive terminal) of the current-voltage conversion circuit 24. The output level regulator 25 is configured of an adder circuit (including an operational amplifier and resistors R2 to R4), and regulates the gain and offset of the current sensing output.

Next, a description will be given of the action of the power semiconductor device current detector circuit according to the first working example of the invention, but as the principle of the action has already been illustrated in FIGS. 3A and 3B, the description here will be confined to simply adding a small supplement.

The first variable voltage source circuit 22, with an output voltage V1 of the current-voltage conversion circuit 24 as an input, can output −Vi to Vi (the gain Kg=−1 to 1) in accordance with the setting of a bit signal. The second variable voltage source circuit 23, with an output voltage Vref of the reference potential output IC as an input, can output −Vref to Vref (the offset Ko=−1 to 1) in accordance with the setting of a bit signal.

The gain Kg and offset Ko are regulated in accordance with the relationship between the internal resistance Rm0 of the main region and the internal resistance Rs0 of the sensing region. At this time, an output wherein the outputs of the first variable voltage source circuit 22 and second variable voltage source circuit 23 are added together (the added output is added to the positive terminal (reference terminal) of the operational amplifier provided in the current-voltage conversion circuit 24 and, as the output is added to the virtually short-circuited negative terminal, the result is that the output becomes the potential of the sense terminal S) is $$Vs = (R7/R5) \times (R1 \times Is) \times Kg + (R7/R6) \times Vref \times Ko$$

$$= \{(R7/R5) \times R1 \times Kg\} \times Is + \{(R7/R6) \times Vref \times Ko\},$$

and the gain Kg and offset Ko function as a simulated resistance and offset voltage respectively.

Herein, the gain Kg and offset Ko are regulated in such a way that $$Rm0 \approx Rs0 + \{(R7/R5) \times R1 \times Kg\}$$

$$Vthm0 Vths0 + \{(R7/R6) \times Vref \times Ko\}$$

By so doing, it is possible to correct a difference in characteristics between the main region and sensing region, and linearize an Im-Is characteristic.

Figure 6:
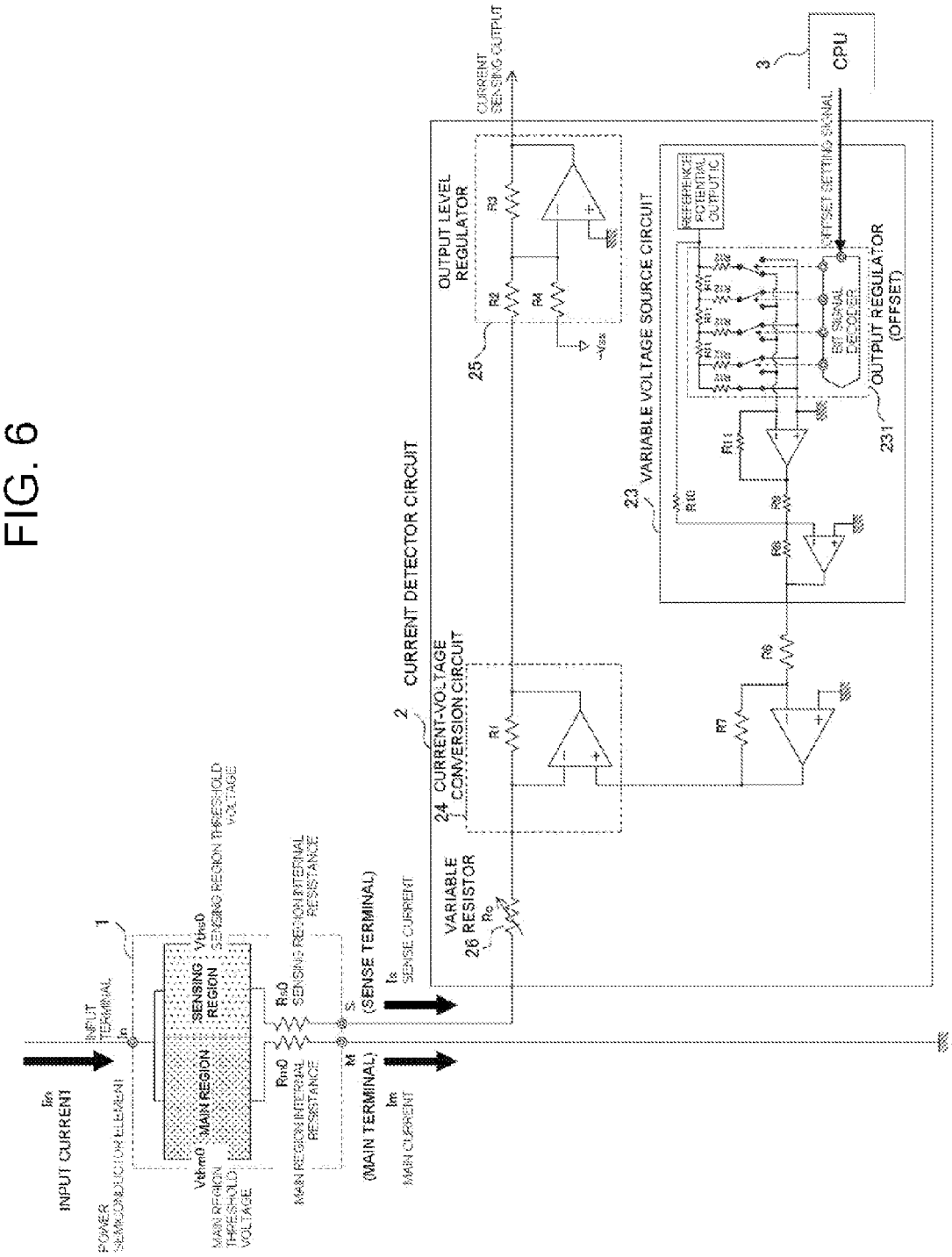
FIG. 6 is a diagram showing a second working example of the power semiconductor device current detector circuit according to the embodiment of the invention.

FIG. 6 is a diagram showing a second working example of the power semiconductor device current detector circuit according to the embodiment of the invention. The fourth configuration principle of the power semiconductor device current detector circuit according to the embodiment of the invention shown in FIGS. 4A and 4B is realized in FIG. 6.

In the second working example of the invention shown in FIG. 6, the power semiconductor device current detector circuit according to the embodiment of the invention is configured of the current-voltage conversion circuit 24, the variable voltage source circuit 23, the variable resistor 26, and the output level regulator 25.

The output level regulator 25 is configured of an adder circuit (including the operational amplifier and resistors R2 to R4), and regulates the gain and offset of the current sensing output.

Next, a description will be given of the action of the power semiconductor device current detector circuit according to the second working example of the invention, but as the principle of the action has already been illustrated in FIGS. 4A and 4B, the description here will be confined to simply adding a small supplement.

Comparing the internal resistance Rm0 of the main region and internal resistance Rs0 of the sensing region, when $$Rm0 > Rs0,$$

the voltage Vs of the sense terminal S is $$Vs = Rc \times Is,$$

and the sense terminal voltage Vs rises in proportion to an increase of the current.

Also, when the offset Ko is regulated, a potential Vrc of the terminal of the variable resistor 26 connected to the current-voltage conversion circuit 24 becomes $$Vrc = (R7/R6) \times Vref \times Ko,$$

as a result of which the sense terminal voltage Vs becomes $$Vs = Rc \times Is + \{(R7/R6) \times Vref \times Ko\},$$

and the offset Ko functions as a simulated offset voltage.

Herein, the variable resistance value Rc and offset Ko are regulated in such a way that $$Rm0 \approx Rs0 + Rc$$

$$Vthm0 \approx Vths0 + \{(R7/R6) \times Vref \times Ko\}.$$

By so doing, it is possible to correct a difference in characteristics between the main region and sensing region, and linearize the Im-Is characteristic.

Figure 14:
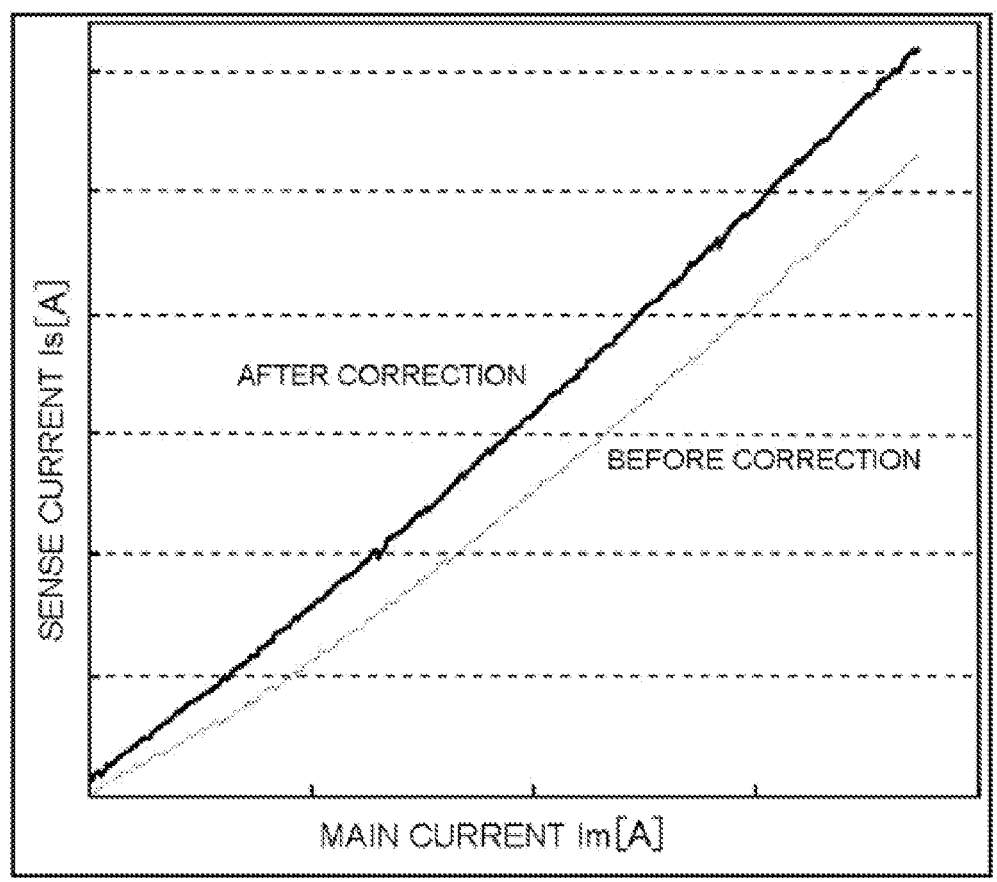
FIG. 14 is a diagram showing a condition of an improvement of the linearity of an Im-Is characteristic by the power semiconductor device current detector circuit of the invention.

FIG. 14 shows a condition wherein the linearity of the Im-Is characteristic is improved. FIG. 14 is a diagram showing a condition of an improvement of the linearity of the Im-Is characteristic by the power semiconductor device current detector circuit of the invention. As shown in FIG. 14, before the correction of the Im-Is characteristic, the ratio between a main current Im and the sense current Is is not constant, and the Im-Is characteristic curves. As opposed to this, when employing the power semiconductor device current detector circuit of the invention to carry out a correction of the Im-Is characteristic, it can be seen that the Im-Is characteristic approximates a straight line, and the linearity thereof is improved.

Figure 7:
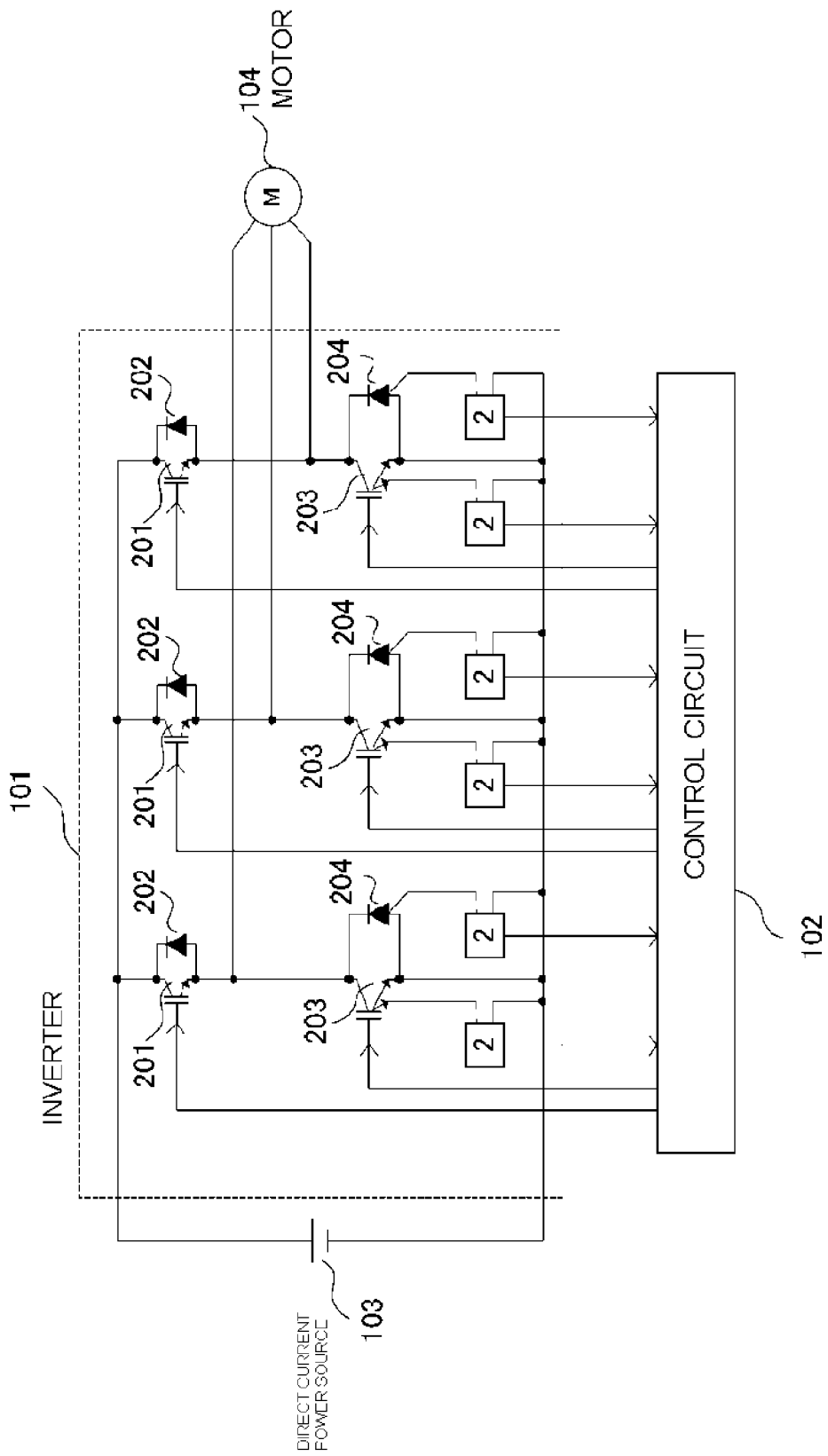
FIG. 7 is a diagram showing an example of a configuration of an inverter device to which the power semiconductor device current detector circuit of the invention is applied.

FIG. 7 is a diagram showing an example of a configuration of an inverter device to which the power semiconductor device current detector circuit of the invention is applied. In the inverter device shown in FIG. 7, the sensing function-equipped IGBT 203 shown in the working examples of the invention, and a sensing function-equipped FWD 204, are applied in a lower arm. That is, the current detector circuit 2 shown in the working examples of the invention is connected to each sense terminal S. In this case, the current detector circuit 2 may be that in either the first working example or second working example.

Figure 10:
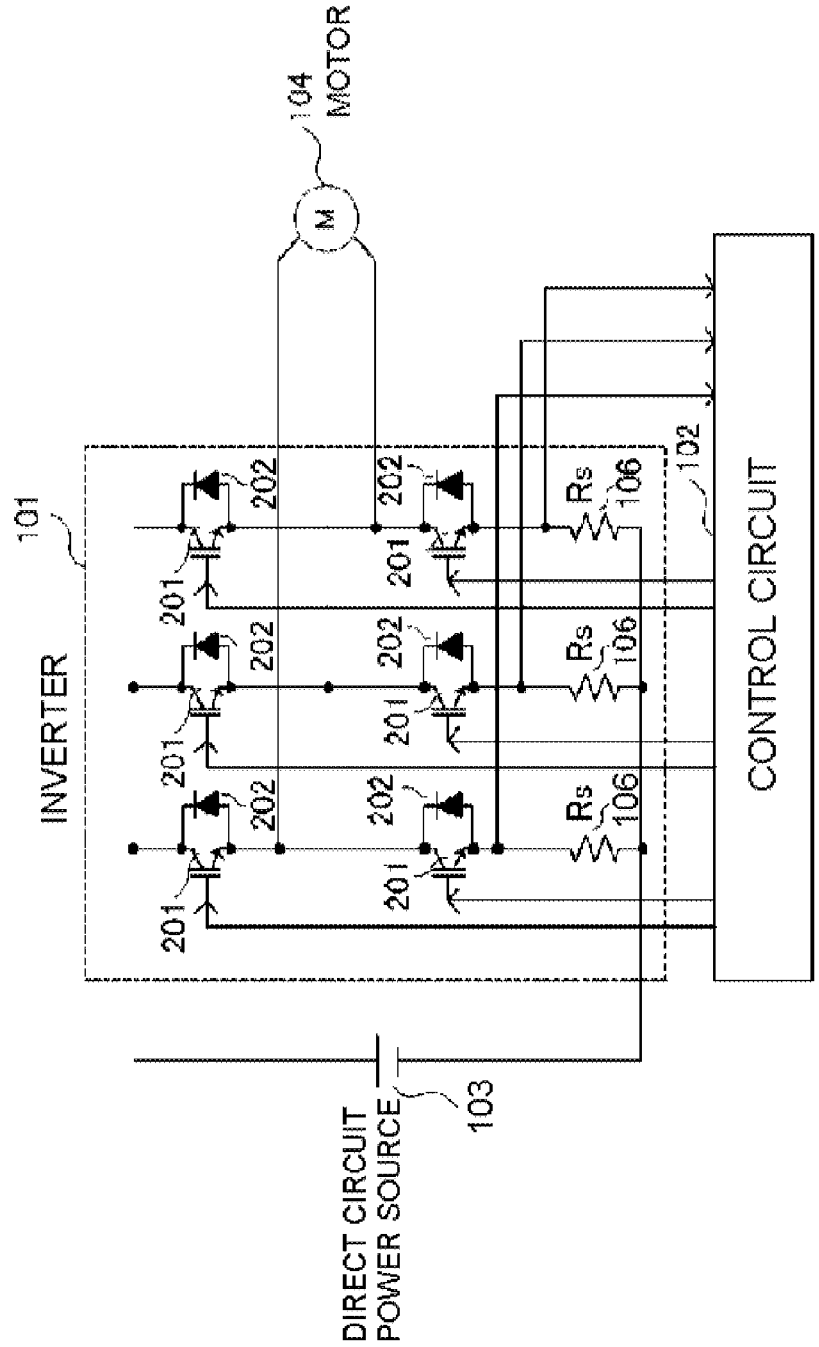
FIG. 10 is a diagram showing an example of a configuration of a heretofore known inverter device in which a shunt resistor is used.

By configuring in this way, it is possible to detect a lower arm current in a three-phase inverter device, and by so doing, it is possible to accurately detect the output current of the inverter device. As the rest of the configuration is the same as that of the heretofore known inverter device shown in FIG. 10, a description thereof will be omitted.

Figure 8:
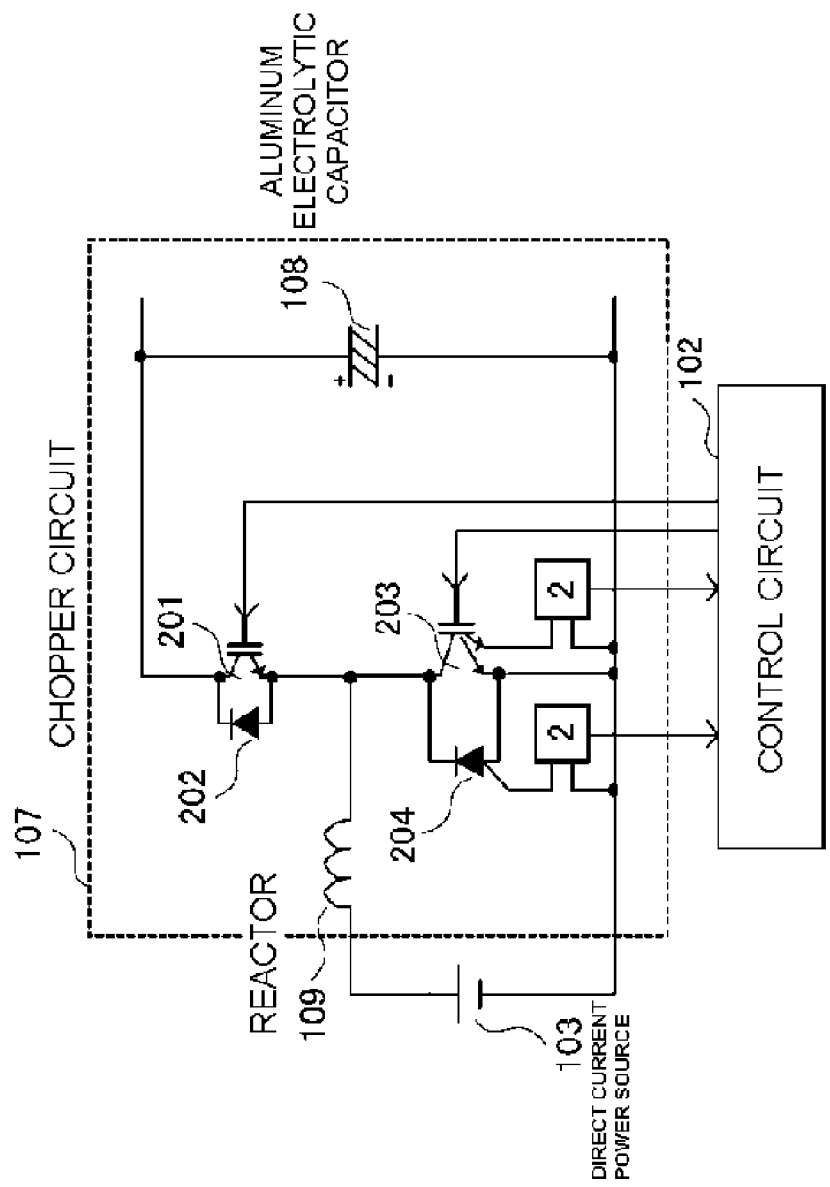
FIG. 8 is a diagram showing an example of a configuration of a chopper circuit to which the power semiconductor device current detector circuit of the invention is applied.
Figure 9:
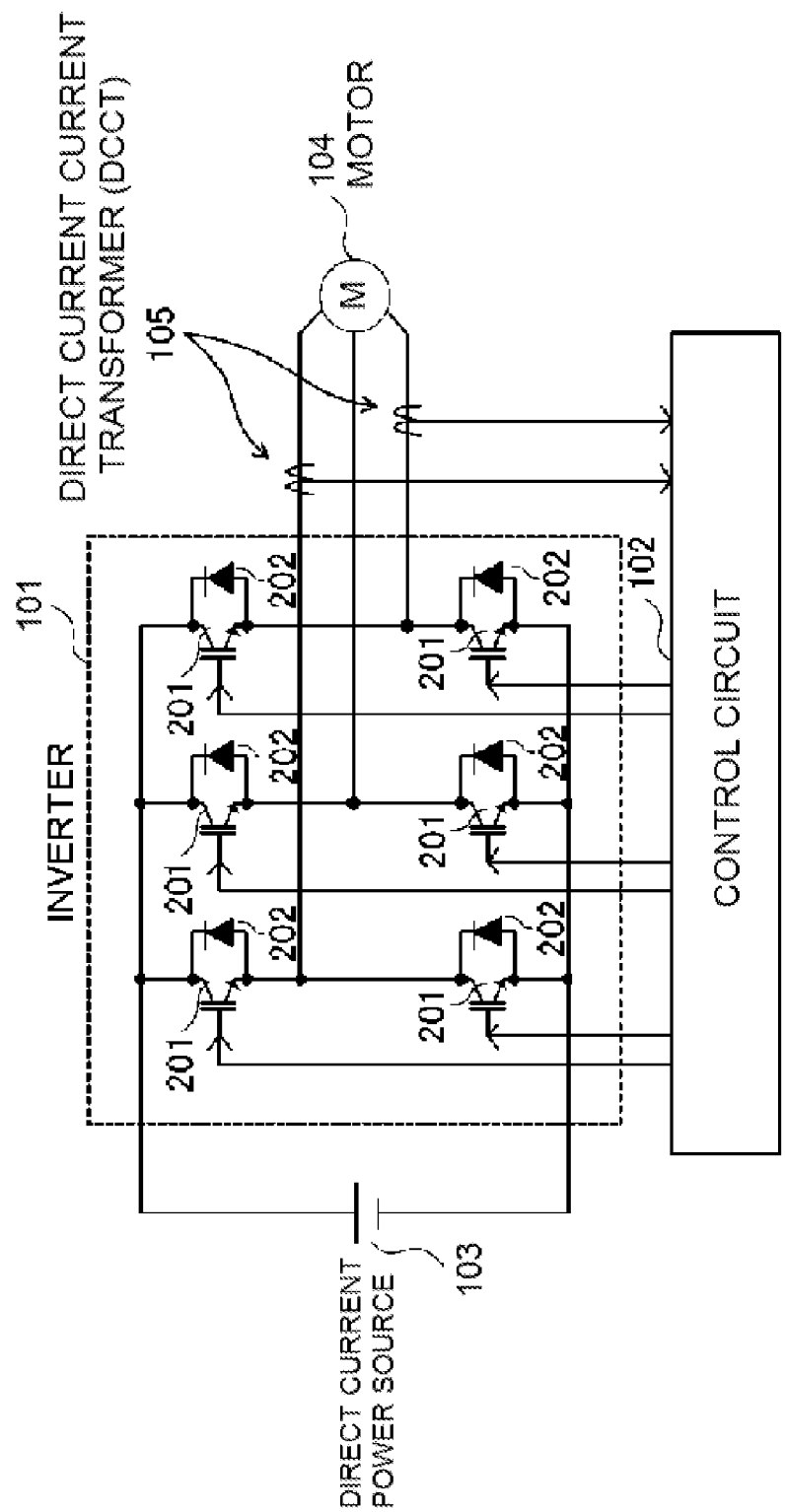
FIG. 9 is a diagram showing an example of a configuration of a heretofore known inverter device in which a DCCT is used.

FIG. 8 is a diagram showing an example of a configuration of a chopper circuit to which the power semiconductor device current detector circuit of the invention is applied. In the chopper circuit shown in FIG. 8, an example of a DC chopper circuit being shown, the sensing function-equipped IGBT 203 shown in the working examples of the invention, and the sensing function-equipped FWD 204, are applied in a lower arm. That is, the current detector circuit 2 shown in the working examples of the invention is connected to the sense terminal of each of the IGBT 203 and FWD 204. In this case, the current detector circuit 2 may be that in either the first working example or second working example.

Figure 11:
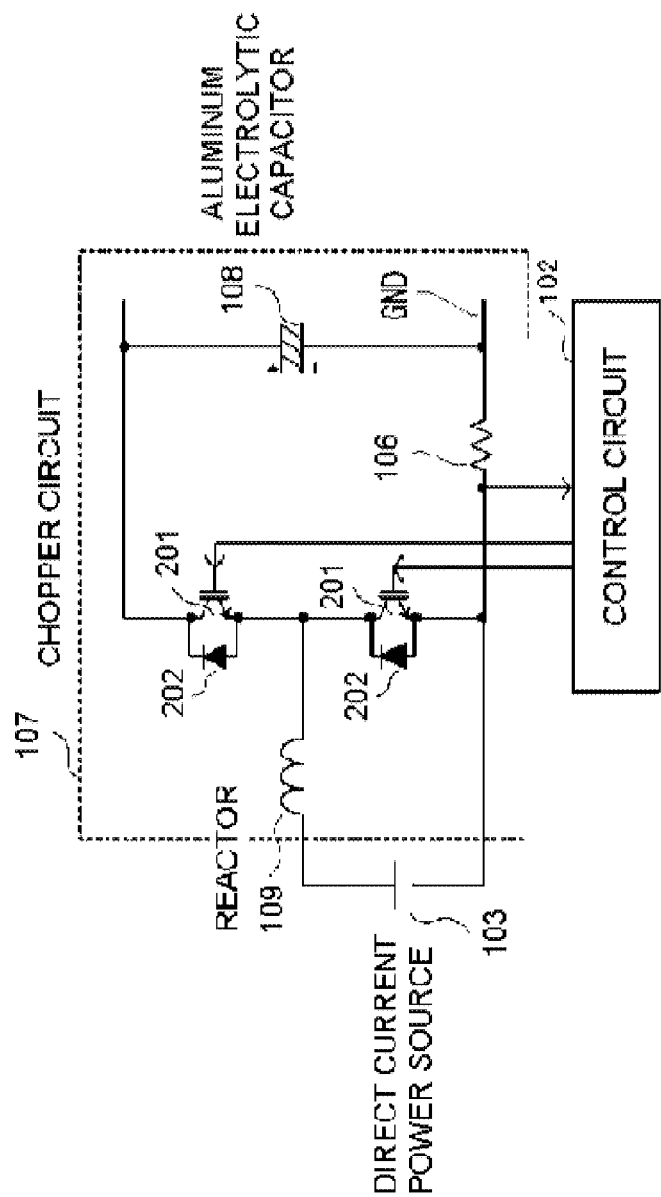
FIG. 11 is a diagram showing an example of a configuration of a heretofore known chopper circuit in which a shunt resistor is used.
Figure 12:
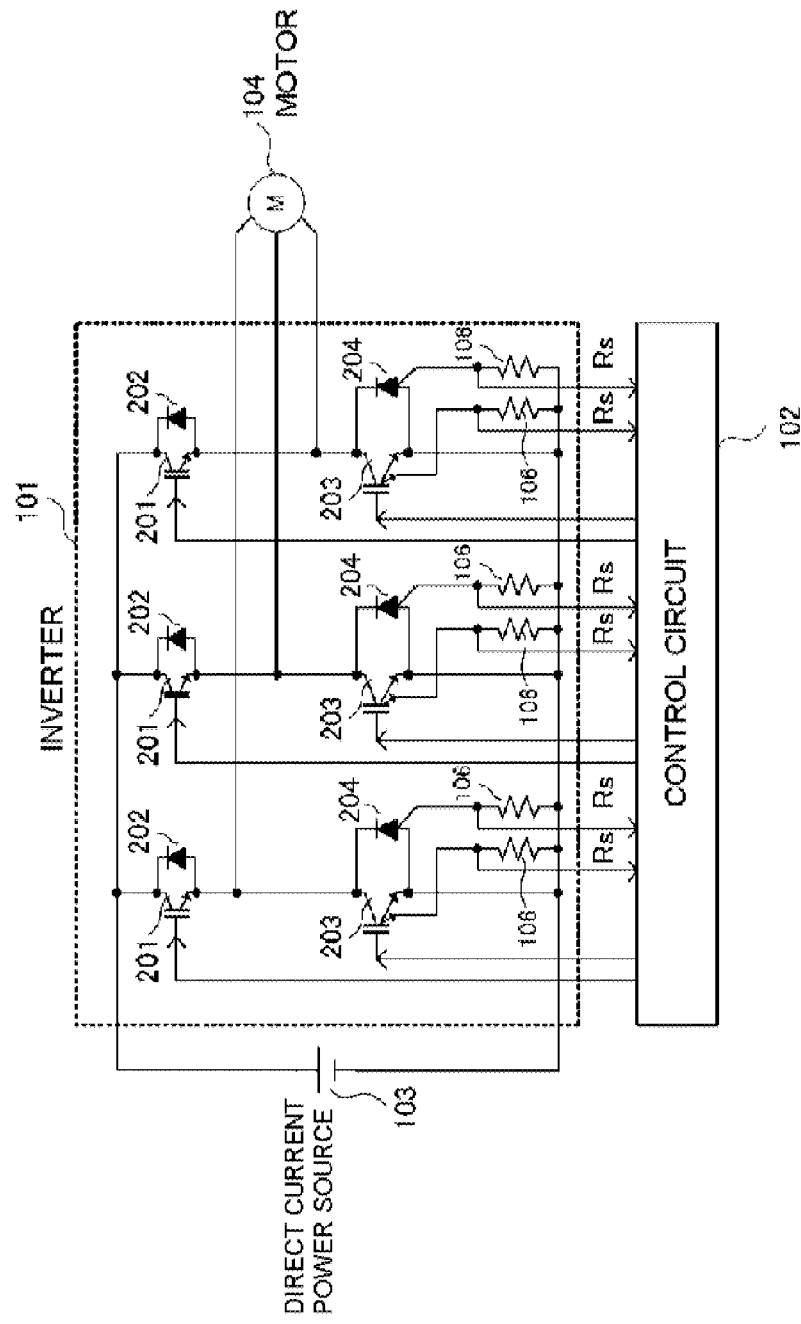
FIG. 12 is a diagram showing an example of a configuration of a heretofore known inverter device in which a sensing function-equipped semiconductor device is used.

By configuring in this way, it is possible to detect a lower arm current of the chopper circuit, and by so doing, it is possible to accurately detect the output current of the chopper circuit. As the rest of the configuration is the same as that of the heretofore known chopper circuit shown in FIG. 11, a description thereof will be omitted.

The invention not being limited to the examples of the inverter device and chopper circuit, it is also possible to apply the power semiconductor device current detector circuit of the invention to other intelligent power module (IPM) applications.

What is claimed is:

1. A current detector circuit of a power semiconductor device, the power semiconductor device including a sensing function-equipped power semiconductor device, the power semiconductor device being divided into a main region and a sensing region, and including a main terminal connected to the main region and a sense terminal connected to the sensing region, the current detector circuit being connected to the sense terminal, the current detector circuit comprising:

a current detector unit including a terminal into which a current to be detected is input, a terminal that has an input current as an output, and a current information output terminal that outputs detected current information; and a variable voltage source circuit including a control input terminal configured to control an output voltage;

the current detector unit and variable voltage source circuit being connected in series;

the current information output terminal of the current detector unit being connected to the control input of the variable voltage source circuit;

the current detector unit and the variable voltage source circuit being connected to the sense terminal and the main terminal; and a potential of the sense terminal being regulated by the output voltage of the variable voltage source circuit based on the current flowing through the sense terminal, the variable voltage source circuit being configured to correct a difference in characteristics between the main region and the sensing region.

2. The power semiconductor device current detector circuit according to claim 1, wherein the variable voltage source circuit is divided into a first variable voltage source circuit and a second variable voltage source circuit, the current detector unit, the first variable voltage source circuit, and the second variable voltage source circuit are connected in series, the current information output terminal of the current detector unit is connected to the control input of the first variable voltage source circuit, the potential of the sense terminal is regulated by the output voltage of the first variable voltage source circuit and the output voltage of the second variable voltage source circuit based on the current flowing through the sense terminal, the first variable voltage source circuit, and the second variable voltage source circuit being configured to correct a difference in characteristics between the main region and the sensing region.

3. The power semiconductor device current detector circuit according to claim 2, wherein the variable voltage source circuit is divided into a variable voltage source element and a variable resistor, and the variable voltage source element, the variable resistor, and the current detector unit are connected in series, and the potential of the sense terminal is regulated by regulating the resistance value of the variable resistor and the output of the variable voltage source element, the variable voltage source circuit being configured to correct a difference in characteristics between the main region and the sensing region.

4. The power semiconductor device current detector circuit according to claim 1, wherein the current detector unit is a current-voltage conversion circuit.

5. The power semiconductor device current detector circuit according to claim 1, further comprising:
   a reference voltage input terminal; and
   a second variable voltage source circuit configured to output a voltage;
   a gain amount being controlled and set by a digital signal that is multiplied by a reference voltage, wherein a gain regulating function is controlled by the digital signal, which is supplied from an exterior.

6. An inverter device including an IGBT (insulated gate bipolar transistor) and FWD (free wheeling diode) in both an upper arm switching element and a lower arm switching element, wherein the IGBT provided in the lower arm switching element is a sensing function-equipped IGBT and the FWD provided in the lower arm switching element is a sensing function-equipped FWD, and the current detector circuit according to claim 1 is connected to each sense terminal of the sensing function-equipped IGBT and the sensing function-equipped FWD.

7. A chopper circuit including an IGBT (insulated gate bipolar transistor) and FWD (free wheeling diode) in both an upper arm switching element and a lower arm switching element, wherein the IGBT provided in the lower arm switching element is a sensing function-equipped IGBT and the FWD provided in the lower arm switching element is a sensing function-equipped FWD, and the current detector circuit according to claim 1 is connected to each sense terminal of the sensing function-equipped IGBT and the sensing function-equipped FWD.

8. A current detection method for a power semiconductor device, the power semiconductor device including a current detector circuit and a sensing function-equipped power semiconductor device, the power semiconductor device being divided into a main region and a sensing region, and including a main terminal connected to the main region and a sense terminal connected to the sensing region, the method comprising:
   providing a current that flows through the main region;
   detecting characteristics of the current with a current detector unit of the current detector circuit, the current detector circuit being connected to the sense terminal;
   detecting a deviation in characteristics between the main region and the sensing region based on the detected current; and
   regulating an offset amount and a gain amount in an output regulator of the current detector circuit, the characteristics of the offset amount coinciding with the characteristics of the gain amount based on the regulation of the output regulator.

9. A power semiconductor device, comprising:
   a main region;
   a sensing region;
   a main terminal connected to the main region;
   a sense terminal connected to the sensing region;
   a sensing function-equipped power semiconductor device;
   a current detector circuit connected to the sense terminal, the current detector circuit comprising:
      a current detector unit including a terminal into which a current to be detected is input, a terminal that has an input current as an output, and a current information output terminal that outputs detected current information; and
      a variable voltage source circuit including a control input terminal configured to control an output voltage;
   the current detector unit and variable voltage source circuit being connected in series;
   the current information output terminal of the current detector unit being connected to the control input of the variable voltage source circuit;
   the current detector unit and the variable voltage source circuit being connected to the sense terminal and the main terminal; and
   a potential of the sense terminal being regulated by the output voltage of the variable voltage source circuit based on the current flowing through the sense terminal, the variable voltage source circuit being configured to correct a difference in characteristics between the main region and the sensing region.

* * * * *